US006466499B1

(12) United States Patent
Blodgett

(10) Patent No.: US 6,466,499 B1
(45) Date of Patent: Oct. 15, 2002

(54) DRAM SENSE AMPLIFIER HAVING PRE-CHARGED TRANSISTOR BODY NODES

(75) Inventor: Greg A. Blodgett, Nampa, ID (US)

(73) Assignee: Micron Technology, Inc., Boise, ID (US)

(*) Notice: Subject to any disclaimer, the term of this patent is extended or adjusted under 35 U.S.C. 154(b) by 8 days.

(21) Appl. No.: 09/614,119

(22) Filed: Jul. 11, 2000

(51) Int. Cl.⁷ .................................................. G11C 7/00

(52) U.S. Cl. ......................... 365/207; 365/205; 365/206

(58) Field of Search ............................ 365/207, 189.01, 365/230.01, 185.21, 205, 206, 208

(56) References Cited

U.S. PATENT DOCUMENTS

| 4,932,002 A |   | 6/1990  | Houston          |         |
|-------------|---|---------|------------------|---------|
| 5,561,630 A |   | 10/1996 | Katoh et al.     |         |
| 5,650,972 A |   | 7/1997  | Tomishima et al. |         |
| 5,963,060 A |   | 10/1999 | Varadarajan et al.|        |
| 5,966,337 A |   | 10/1999 | Lee et al.       |         |
| 5,982,202 A |   | 11/1999 | Peak, Jr.        |         |
| 6,023,436 A |   | 2/2000  | Han              |         |
| 6,133,608 A | * | 10/2000 | Flaker et al.    | 257/347 |
| 6,137,737 A | * | 10/2000 | Mullarkey et al. | 365/201 |

OTHER PUBLICATIONS

Kuge, Shigehiro et al., "SOI–DRAM Circuit Technologies for Low Power High Speed Multigiga Scale Memories," IEEE Journal of Solid State Circuits, vol. 31, No. 4, Apr. 1996, pp. 586–591.
Yamagata, Tadato et al., "Circuit Design Techniques for Low–Voltage Operating and/or Giga–Scale DRAMs," 1995 IEEE International Solid–state Circuits Conference, Feb. 7, 1995, pp. 248–249.

* cited by examiner

Primary Examiner—Son T. Dinh
(74) Attorney, Agent, or Firm—Dickstein Shapiro Morin & Oshinsky LLP

(57) ABSTRACT

A DRAM sense amplifier that reduces the leakage current through the sense amplifier circuitry while the array is active, while controlling the body voltage of the sense amplifier transistors to improve performance of the sense amplifier circuitry is disclosed. The body nodes of the sense amplifier transistors are pre-charged to a voltage potential, such as for example Vcc/2. The body nodes are disconnected from the pre-charge voltage while the sense amplifier is enabled, i.e., during an access operation, but the threshold voltage $V_t$ of the sense amplifier transistors will be lower during sensing due to the pre-charge level. As the body potential drops during sensing, the threshold voltage $V_t$ will increase, thereby reducing the leakage current that flows through the sense amplifier while the digit lines are separated.

101 Claims, 8 Drawing Sheets

DRAM SENSE AMPLIFIER HAVING PRE-CHARGED TRANSISTOR BODY NODES

BACKGROUND OF THE INVENTION

1. Field of the Invention

The present invention relates generally to a semiconductor memory device and, more particularly, to a sense amplifier fabricated using silicon on insulator (SOI) technology.

2. Description of the Related Art

An increasing number of electronic equipment and electronic-based systems require some form of high-speed memory devices for storing and retrieving information (or "data"). While the types of such memory devices vary widely, semiconductor memory devices are most commonly used in memory applications requiring implementation in a relatively small area. Within this class of semiconductor memory devices, the DRAM (Dynamic Random Access Memory) is one of the more commonly used types.

The DRAM has memory arrays consisting of a number of intersecting row and column lines of individual transistors or memory cells. In a conventional dynamic random access memory (DRAM) device each memory cell, or memory bit, consists of one transistor and one capacitor. A terminal of the transistor is connected to a digit line, or bitline, of the memory device. Another terminal of the transistor is connected to a terminal of the capacitor and the gate terminal of the transistor is connected to a wordline of the memory device. The transistor thus acts as a gate between the digit line and the capacitor.

The second terminal of the capacitor is connected to a voltage rail which carries a voltage, such as Vcc/2. Thus, when the wordline for a particular cell is active, the gate transistor is in a conducting state and the capacitor is connected to the digit line. The capacitor stores a charge that, depending on whether the capacitor is charged or discharged, represents either a logic high or a logic low value.

Typically, a microcomputer circuit selects (or activates) particular row and column lines to access selected memory cells. "Access" typically refers to reading data from or writing data to selected memory cells. Reading data from the memory cells involves the use of a sense amplifier to detect whether the voltage level stored in the memory cell represents a binary one (logic high) or a binary zero (logic low).

Memory devices are typically constructed with complementary digit lines of equal capacitance. Sense amplifiers are connected between the digit lines and operate to sense the differential voltage across the digit lines. Before a memory cell is selected for access, the complementary digit lines must be equilibrated. Equilibration circuits typically short the complementary digit lines together, resulting in an equilibrate voltage equal to the voltage midpoint between the two equal capacitance and logically opposite digit lines. Conventionally, a DRAM contains one sense amplifier for a designated group (row or column) of memory cells. If the voltage level stored in the memory cell represents a binary zero, one of the digit lines will increase in level, typically to a supply voltage Vcc, and the other digit line will decrease in level, typically to a ground level. If the voltage level stored in the selected memory cell corresponds to a binary one, a change in the opposite direction occurs. Through this complementary operation, the sense amplifier yields a single output signal which is coupled through an output buffer to an output pin of the DRAM device.

FIG. 1 illustrates a sense amplifier 10 of a DRAM device having a first array ARRAY0 20 and a second array ARRAY1 22, each of which comprises a plurality of memory cells 21 (shown in ARRAY0 20). As is generally known in the art, the term sense amplifier includes a collection of circuit elements connected to the digit lines of a DRAM array. This collection typically includes isolation transistors, devices for equilibration and bias, one or more N-sense amplifiers, one or more P-sense amplifiers, and devices connecting selected digit lines to input/output signal lines as will be described below.

As shown in FIG. 1, sense amplifier 10 includes a P-sense amplifier 70 and an N-sense amplifier 80 for sensing charge stored in the selected memory cell of the selected array 20, 22 via a voltage differential on the pair of digit lines D0 24 and D0* 26. One of the arrays 20, 22 is selected by application of signals ISOa and ISOb to transistors 32a, 32b and 34a, 34b, respectively. Thus, when ISOa is driven to a logic high value and ISOb is driven to a logic low value, transistors 32a and 32b become conductive, i.e., turn on, to connect ARRAY0 20 to P-sense amplifier 70 and N-sense amplifier 80 while transistors 34a and 34b do not conduct, i.e., turn off, to isolate ARRAY1 22 from P-sense amplifier 70 and N-sense amplifier 70. When ISOa is driven to a logic low value and ISOb is driven to a logic high value, transistors 34a and 34b turn on to connect ARRAY1 22 to P-sense amplifier 80 and N-sense amplifier 70 while transistors 32a and 32b turn off to isolate ARRAY0 20 from P-sense amplifier 80 and N-sense amplifier 70.

Equilibration circuits 50a and 50b are provided to equilibrate the digit lines D0 24 and D0 26. Equilibration circuit 50a includes transistor 54 with a first source/drain region coupled to digit line D0 24, a second source/drain region coupled to digit line D0* 26 and a gate coupled to receive an equilibration signal EQa. Equilibration circuit 50a further includes first and second transistors 56 and 58. Transistor 56 includes a first source/drain region that is coupled to digit line DO 24, a gate that is coupled to receive the equilibration signal EQa and a second source/drain region that is coupled to receive an equilibration voltage Veq, which, as noted, is typically equal to Vcc/2. Second transistor 58 includes a first source/drain region that is coupled to digit line D0* 26, a gate that is coupled to receive the equilibration signal EQa and a second source/drain region that is coupled to the equilibration voltage Veq. When the signal EQa is at a high logic level, equilibration circuit 50a effectively shorts digit line D0 24 to digit line D0* 26 such that both lines are equilibrated to the voltage Veq. Equilibration circuit 50b is constructed in a similar manner to equilibration circuit 50a and operates when the EQb signal is at a high logic level.

When P-sense amplifier 70 and N-sense amplifier 80 have sensed the differential voltage across the digit lines D0 24 and D0* 26 (as described below), a signal representing the charge stored in the accessed memory cell is output from the DRAM device on the input/output (I/O) lines I/O 36 and I/O* 38 by connecting the I/O lines I/O 36 and I/O* 38 to the digit lines D0 24 and D0* 26, respectively. A column select (CSEL) signal is applied to transistors 40, 42 to turn them on and connect the digit lines D0 24 and D0* 26 to the I/O lines I/O 36 and I/O* 38.

The operation of the P-sense amplifier 80 and N-sense amplifier 70 is as follows. These amplifiers work together to detect the access signal voltage and drive the digit lines D0 24 and D0* 26 to Vcc and ground accordingly. As shown in FIG. 1, the N-sense amplifier 80 consists of cross-coupled NMOS transistors 82, 84 and drives the low potential digit line to ground. Similarly, the P-sense amplifier 70 consists of cross-coupled PMOS transistors 72, 74 and drives the high potential digit line to Vcc. The NMOS pair 82, 84 or N-sense-amp common node is labeled RNL*. Similarly, the P-sense-amp 70 common node is labeled ACT (for ACTive pull-up). Initially, RNL* is biased to Vcc/2 and ACT is biased to ground. Since the digit line pair D0 24 and D0* 26 are both initially at Vcc/2 volts, the N-sense-amp transistors 82, 84 remain off due to zero Vgs potential. Similarly, both P-sense-amp transistors 72, 74 remain off due to their negative Vgs potential. As discussed in the preceding paragraph, a signal voltage develops between the digit line pair 24, 26 when the memory cell access occurs. While one digit line contains charge from the cell access, the other digit line serves as a reference for the sensing operation. The sense amplifier firing generally occurs sequentially rather than concurrently. The N-sense-amp 80 fires first and the P-sense-amp 70 second. Dropping the RNL* signal toward ground will fire the N-sense-amp 80. As the voltage between RNL* and the digit lines approaches the transistor threshold voltage $V_t$, the NMOS transistor whose gate connection is to the higher voltage digit line will begin to conduct. Conduction results in the discharge of the low voltage digit line toward the RNL* voltage. Ultimately, RNL* will reach ground, bringing the digit line with it. Note that the other NMOS transistor will not conduct since its gate voltage derives from the low voltage digit line, which is discharging toward ground.

Shortly after the N-sense-amp 80 fires, ACT will be driven toward Vcc. This activates the P-sense-amp 70 that operates in a complementary fashion to the N-sense-amp 80. With the low voltage digit line approaching ground, a strong signal exists to drive the appropriate PMOS transistor into conduction. This will charge the high voltage digit line toward ACT, ultimately reaching Vcc. Since the memory bit transistor remains on during sensing, the memory bit capacitor will charge to the RNL* or ACT voltage level. The voltage, and hence charge, which the memory bit capacitor held prior to accessing will restore a full level, i.e., Vcc for a logic one and GND for a logic zero.

There has been renewed interest in the fabrication of DRAMs using Silicon on Insulator (SOI) technology. In an SOI device, an insulating layer is provided between the transistors of the DRAM and the substrate. While this technology is currently more expensive in terms of manufacturing costs, the are some compelling benefits. Transistors manufactured within an SOI device tend to be faster due to significantly reduced junction capacitance. Further, these devices are immune to latch-up, and have significantly reduced software error rates.

There are, however, certain problems associated with SOI devices. In an SOI device, if body contacts are not provided, the body of the individual transistors are no longer tied to the bulk substrate. Variations in body potential can cause variations in the threshold voltage $V_t$ from device to device and over time based on the previous potentials on the device's source/drain/gate terminals. Variations in the threshold voltage $V_t$ can alter speed paths within a device, or make balanced circuits difficult to produce.

In a DRAM, one particularly sensitive circuit is the sense amplifier, such as sense amplifier 10 illustrated in FIG. 1. As previously described, the sense amplifier 10 is designed to amplify small signal differential on the digit lines D0 24 and D0* 26. In order to properly detect these small differentials, the sense amplifier 10 must be balanced. For SOI technology, the cross coupled NMOS transistors 82, 84 should have matching threshold voltages $V_t$. To ensure that the NMOS transistors 82, 84 have matching threshold voltages $V_t$, the body nodes of the two transistors 82, 84 must be contacted in some way and either tied together or to a common potential. It has been suggested that the NMOS transistor bodies be tied to a high potential to reduce the threshold voltage $V_t$ of the transistors, thereby aiding in the fast sensing of the signals on the digit lines D0 24 and D0* 26. However, low threshold voltages $V_t$ for the transistors in the sense amplifier 10 will lead to an increased leakage current through the sense amplifier 10 whenever the sense amplifier 10 is active, which in turn will degrade the operation of the memory device.

Thus, there exists a need for sense amplifier circuitry that reduces the leakage current through the sense amplifier circuitry while the array is active, while controlling the body voltage of the sense amplifier transistors to improve performance of the sense amplifier circuitry.

SUMMARY OF THE INVENTION

The present invention alleviates the problems associated with the prior art and provides a DRAM sense amplifier that reduces the leakage current through the sense amplifier circuitry while the array is active, while controlling the body voltage of the sense amplifier transistors to improve performance of the sense amplifier circuitry.

In accordance with the present invention, the body nodes of the sense amplifier transistors are pre-charged to a voltage potential, such as for example Vcc/2. The body nodes are disconnected from the pre-charge voltage while the sense amplifier is enabled, i.e., during an access operation, but the threshold voltage $V_t$ of the sense amplifier transistors will be lower during sensing due to the pre-charge level. As the body potential drops during sensing, the threshold voltage $V_t$ will increase, thereby reducing the leakage current that flows through the sense amplifier while the digit lines are electrically separated.

These and other advantages and features of the invention will become more readily apparent from the following detailed description of the invention which is provided in connection with the accompanying drawings.

DETAILED DESCRIPTION OF THE PREFERRED EMBODIMENTS

Figure 1:
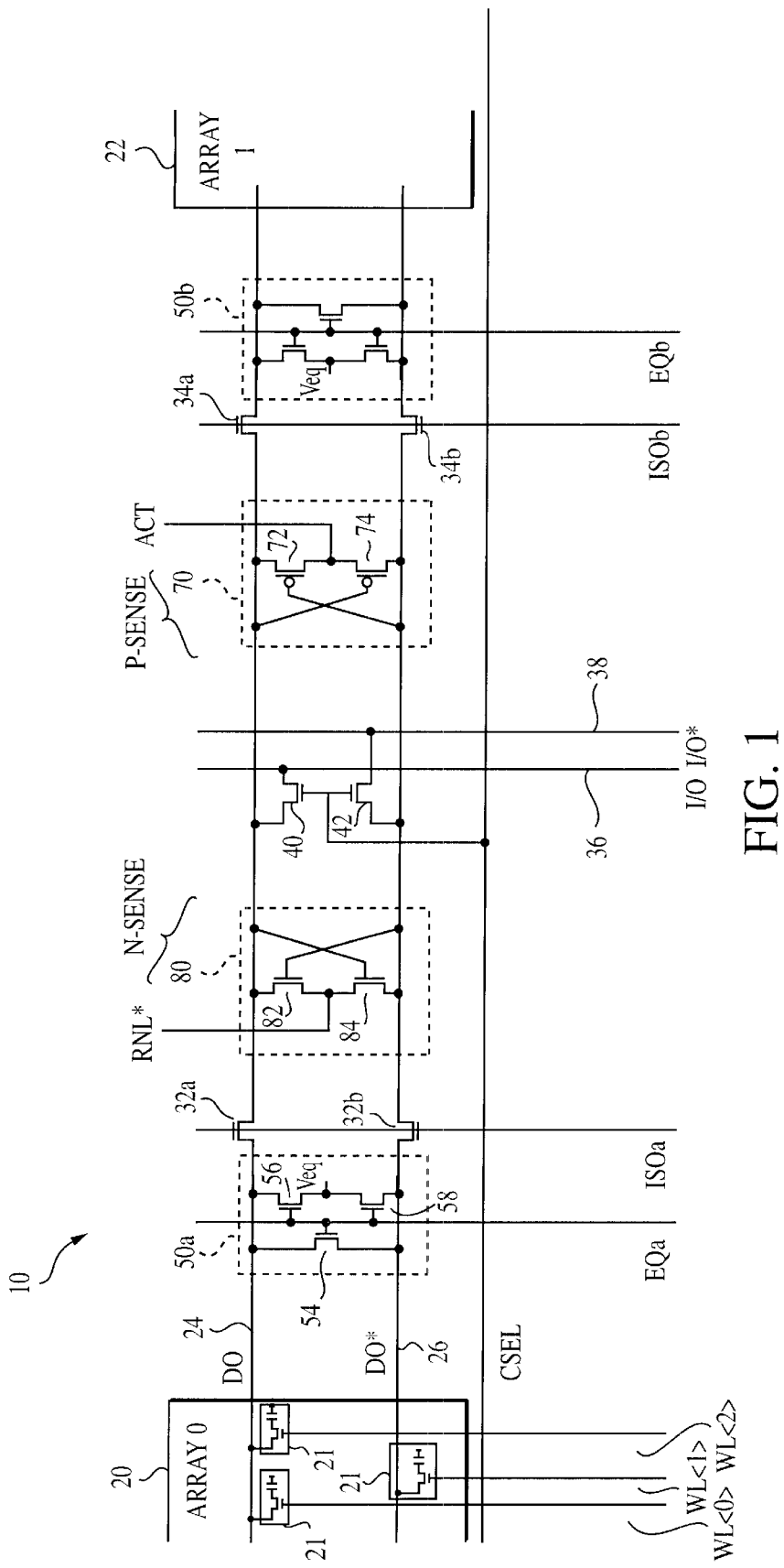
FIG. 1 illustrates a portion of a known DRAM device.

The present invention will be described as set forth in the preferred embodiments illustrated in FIGS. 2–6. Other embodiments may be utilized and structural or logical changes may be made without departing from the spirit or scope of the present invention. Like items are referred to by like reference numerals.

In accordance with the present invention, the body nodes of the sense amplifier transistors are pre-charged to a voltage potential, such as for example Vcc/2. The body nodes are disconnected from the pre-charge voltage while the sense amplifier is enabled, i.e., during an access operation, but the threshold voltage $V_t$ of the sense amplifier transistors will be lower during sensing due to the pre-charge level. As the body potential drops during sensing, the threshold voltage $V_t$ will increase, thereby reducing the leakage current that flows through the sense amplifier while the digit lines are electrically separated.

Figure 2:
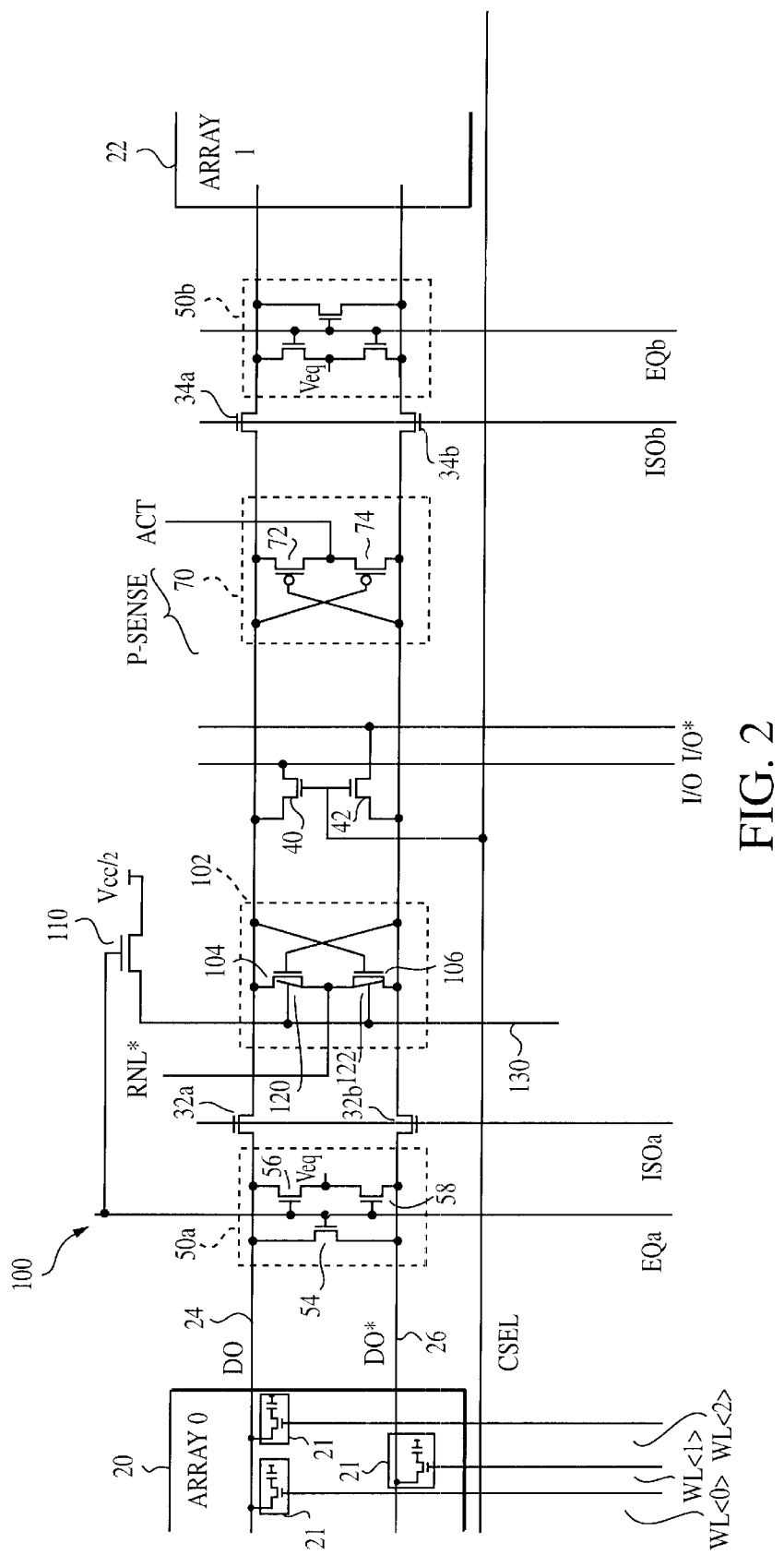
FIG. 2 illustrates a sense amplifier according to a first embodiment of the present invention.

FIG. 2 illustrates a sense amplifier circuit 100 in accordance with a first embodiment of the present invention. Sense amplifier circuit 100 includes a P-sense amplifier 70, a pair of equilibration circuits 50a, 50b, isolation transistors 32a, 32b, 34a, 34b, and I/O transistors 40, 42. Each of these elements is similar to those described with respect to FIG. 1, and their description will not be repeated here. In accordance with the present invention, sense amplifier circuit 100 is further provided with an N-sense amplifier 102 that consists of cross-coupled NMOS transistors 102, 104. The body node 120 of transistor 104 is connected to a signal line 130, which is connected to a supply potential, such as for example Vcc/2, through transistor 110. Similarly, the body node 122 of transistor 106 is connected to signal line 130.

Signal line 130 may be, for example, a metal strap routed through the sense amplifier circuit 100 and connected to the body nodes 120, 122 of transistors 104, 106. While the use of a metal strap is preferable to decrease the time necessary for pre-charging the body nodes, the invention is not so limited and any type of conductor may be used. Additionally, the routing of the metal strap, or other conductor, may be any routing as determined by the layout of the device.

The gate of transistor 110 is connected to receive a control signal, such as for example the equilibration signal EQa used to control equilibration circuit 50a. While FIG. 2 illustrates the gate of transistor 110 connected to the EQa signal, it is to be understood that the invention is not so limited and any control signal that transitions low before an access could be used.

The operation of the sense amplifier circuit 100 is as follows. When the equilibration signal EQa is high, transistor 110 will be on, thereby connecting the signal line 130 to Vcc/2. When signal line 130 is connected to Vcc/2, the body nodes 120, 122 of transistors 102, 106, respectively, will be charged to Vcc/2. Increasing the voltage potential of the body nodes 120, 122 of transistors 104, 106 will reduce the threshold voltage $V_t$ of each transistor 104, 106. When a cell access is to occur, such as for example for memory cell 21 in ARRAY0 20, the equilibration signal EQa will transition from high to low, thereby turning off transistors 54, 56 and 58 to isolate the digit lines D0 24 and D0* 26 from each other. Additionally, when equilibration signal EQa goes low, transistor 110 will also turn off, disconnecting the body nodes 120, 122 of transistors 104, 106, respectively, from the pre-charge potential, i.e., Vcc/2.

The cell 21 is then accessed by transitioning its associated wordline, such as for example WL<2>, from low to high, thereby turning on the cell transistor and allowing the charge stored in the bit capacitor to be read out onto the digit line D0 24. In accordance with the present invention, the pre-charging of the body nodes 120, 122 of transistors 104, 106 to a full Vcc/2 decreases the threshold voltage of transistors 104, 106 such that the RNL* signal can be fired without any delay after the charge stored in the bit capacitor has been read onto the digit line D0 24 as in the prior art. When RNL* is fired, it will be driven from its initial bias level, i.e., Vcc/2, to ground, thereby firing the N-sense amp 102. As the voltage between RNL* and the digit lines approaches the threshold voltage $V_t$ of transistors 104, 106, lowered by the pre-charge of the body nodes 120, 122 to Vcc/2 in accordance with the present invention, the NMOS transistor 104, 106 whose gate connection is to the higher voltage digit line will begin to conduct. Conduction results in the discharge of the low voltage digit line toward the RNL* voltage. Ultimately, RNL* will reach ground, bringing the digit line with it. However, since the body nodes 120, 122 are not shorted directly to RNL* during sensing as in the prior art, the voltage of the body nodes 120, 122 will drop towards ground at a slower rate, resulting in a lower threshold voltage $V_t$ for more of the sensing interval. A lower $V_t$ for a longer period during sensing will decrease the sensing time, thereby improving performance of the sense amplifier circuit 100.

Figure 3:
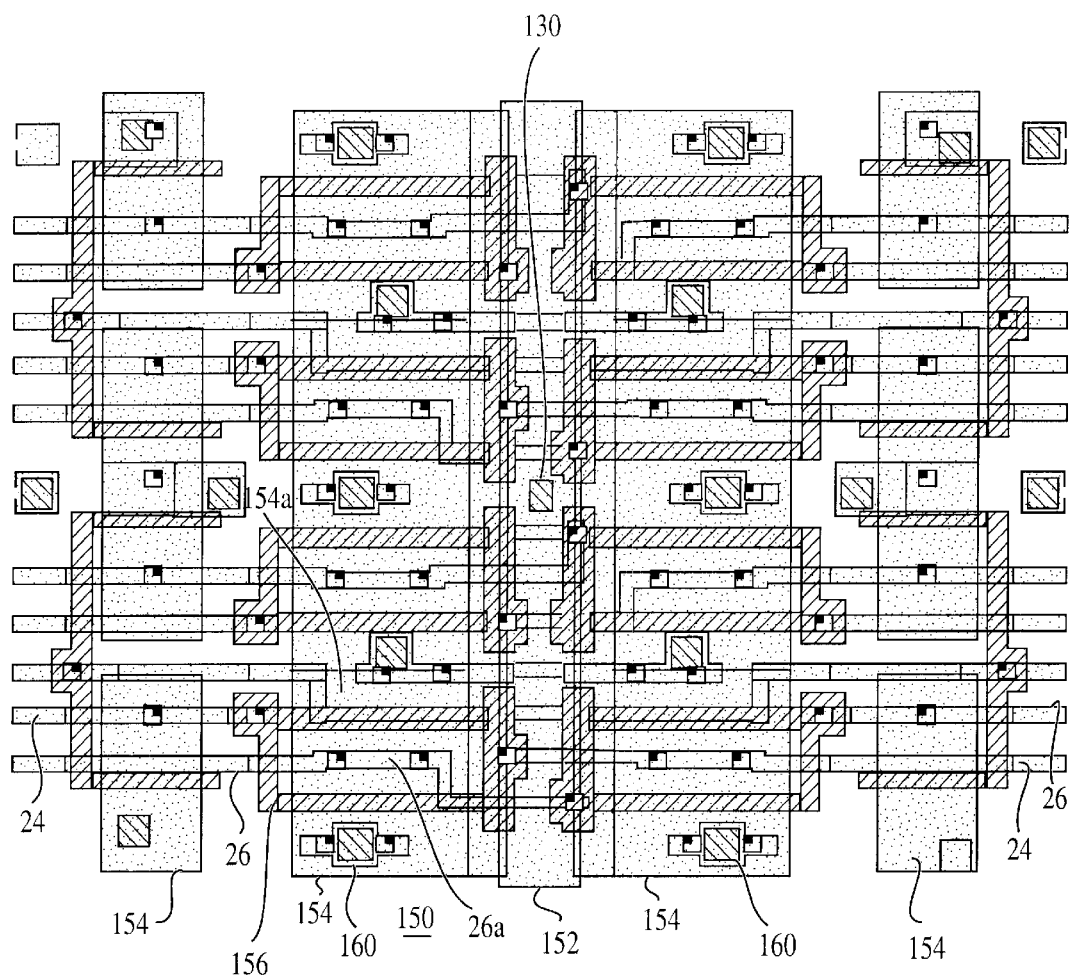
FIG. 3 illustrates the layout of a portion of a sense amplifier according to the present invention.

The voltage level of the body nodes 120, 122 will not drop until after RNL* is low enough to turn on the P-N junction parasitic diode of the transistors 104, 106. FIG. 3 illustrates various layers of a portion of the layout of sense amplifier circuit 100. As illustrated in FIG. 3, a substrate 150 is formed of a p-type material. An insulating layer (not shown) is formed on all or part of the substrate 150. N-type active areas 154 are implanted or formed on the insulating layer in areas where mask 156 is not present. Additionally, the digit lines D0 24 and D0* 26 are formed on the substrate 150. Contacts 160 connect the n-type active areas 154 to other parts of the circuitry, such as for example the RNL* signal. Thus for example, transistor 122 of FIG. 2 includes a first terminal at the digit line D0* 26 at the node labeled 26a, a second terminal connected to the n-type active area at the node labeled 154a, and the gate connected to the digit line D0 24 between them. In accordance with the present invention, a p+ active region 152 is provided that ties together a portion of the n-type active areas 154 in a respective stripe. This forms a p-n diode between the body nodes and source/drain regions of the transistors. As the n-type regions are pulled low by RNL* being driven to ground, the p-n diode will eventually become forward biased and start to conduct. When the p-n diode starts to conduct, the voltage potential at the body nodes 120, 122 will decrease. This decrease in the body voltage during sensing will cause an increase in the threshold voltage $V_t$ of the transistors. The increase in the threshold voltage will subsequently decrease the leakage current through the transistors 104, 106 while the digit lines D0 24 and D0* 26 are electrically separated, thereby improving performance of the sense amplifier circuit 100. FIG. 3 also illustrates a connection point 130 for connecting the p+ region 152, and hence the body nodes of each transistor contacted by the p+ region 152, to the pre-charge voltage in a gap cell of the device.

Figure 4:
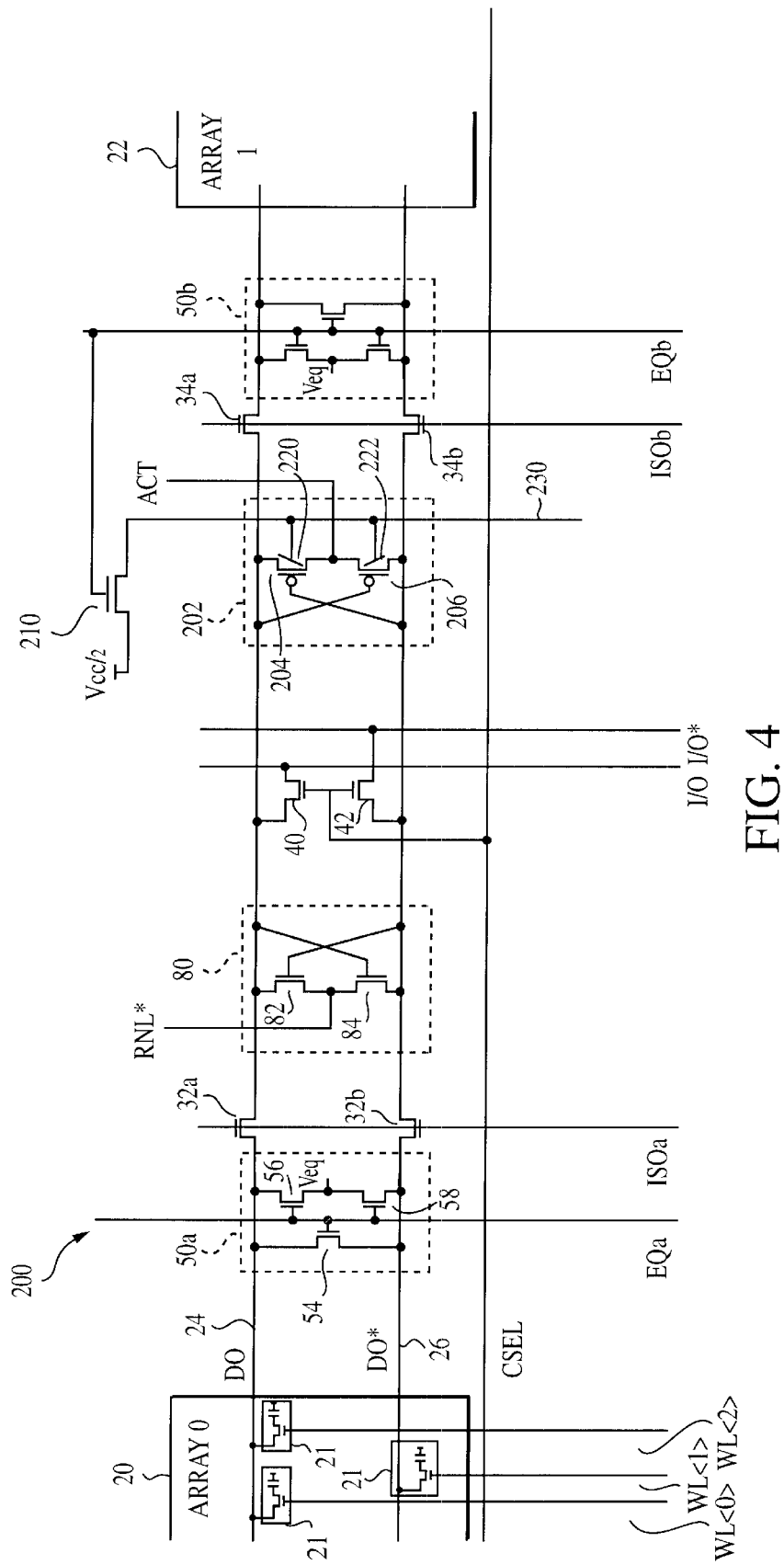
FIG. 4 illustrates a sense amplifier according to a second embodiment of the present invention.

FIG. 4 illustrates a sense amplifier circuit 200 in accordance with a second embodiment of the present invention. Sense amplifier circuit 200 includes an N-sense amplifier 80, a pair of equilibration circuits 50a, 50b, isolation transistors 32a, 32b, 34a, 34b, and I/O transistors 40, 42. Each of these elements is similar to those described with respect to FIG. 1, and their description will not be repeated here. In accordance with the present invention, sense amplifier circuit 200 is further provided with an P-sense amplifier 202 that consists of cross-coupled PMOS transistors 204, 206. The body node 220 of transistor 204 is connected to a signal line 230, which is connected to a supply potential, such as for example Vcc/2, through transistor 210. Similarly, the body node 222 of transistor 206 is connected to signal line 230. The gate of transistor 210 is connected to receive a control signal, such as for example the equilibration signal EQb used to control equilibration circuit 50b as shown in FIG. 4.

The operation of the sense amplifier circuit 200 is as follows. When the equilibration signal EQb is high, transistor 210 will be on, thereby connecting the signal line 230 to Vcc/2. When signal line 230 is connected to Vcc/2, the body nodes 220, 222 of transistors 204, 206, respectively, will be charged to Vcc/2. Charging the body nodes 220, 222 of transistors 204, 206 will reduce the threshold voltage $V_t$ of each transistor 204, 206, as is well known in the art. When a cell access is to occur, such as for example a memory cell 21 in ARRAY0 20, the equilibration signal EQb will transition from high to low, thereby turning off transistor 54, 56 and 58 to isolate the digit lines D0 24 and D0* 26 from each other. Additionally, when equilibration signal EQb goes low, transistor 210 will also turn off, disconnecting the body nodes 220, 222 of transistors 204, 206, respectively, from the pre-charge potential, i.e., Vcc/2.

The cell 21 is then accessed by transitioning its associated wordline, such as for example WL<2>, from low to high, thereby turning on the cell transistor and allowing the charge stored in the bit capacitor to be read out onto the digit line D0 24. The N-sense amplifier 80 will operate as described with respect to FIG. 1. Shortly after the N-sense-amp 80 fires by dropping RNL* to ground, ACT will be driven toward Vcc. As the voltage between ACT and the digit lines approaches the threshold voltage $V_t$ of transistors 204, 206, lowered by the pre-charge of the body nodes 220, 222 to Vcc/2 in accordance with the present invention, the PMOS transistor 204, 206 whose gate connection is to the lower voltage digit line will begin to conduct. Conduction results in the charging of the high voltage digit line toward the ACT voltage. A lower $V_t$ for a longer period during sensing will decrease the sensing time, thereby improving performance of the sense amplifier circuit 200.

Figure 5A:
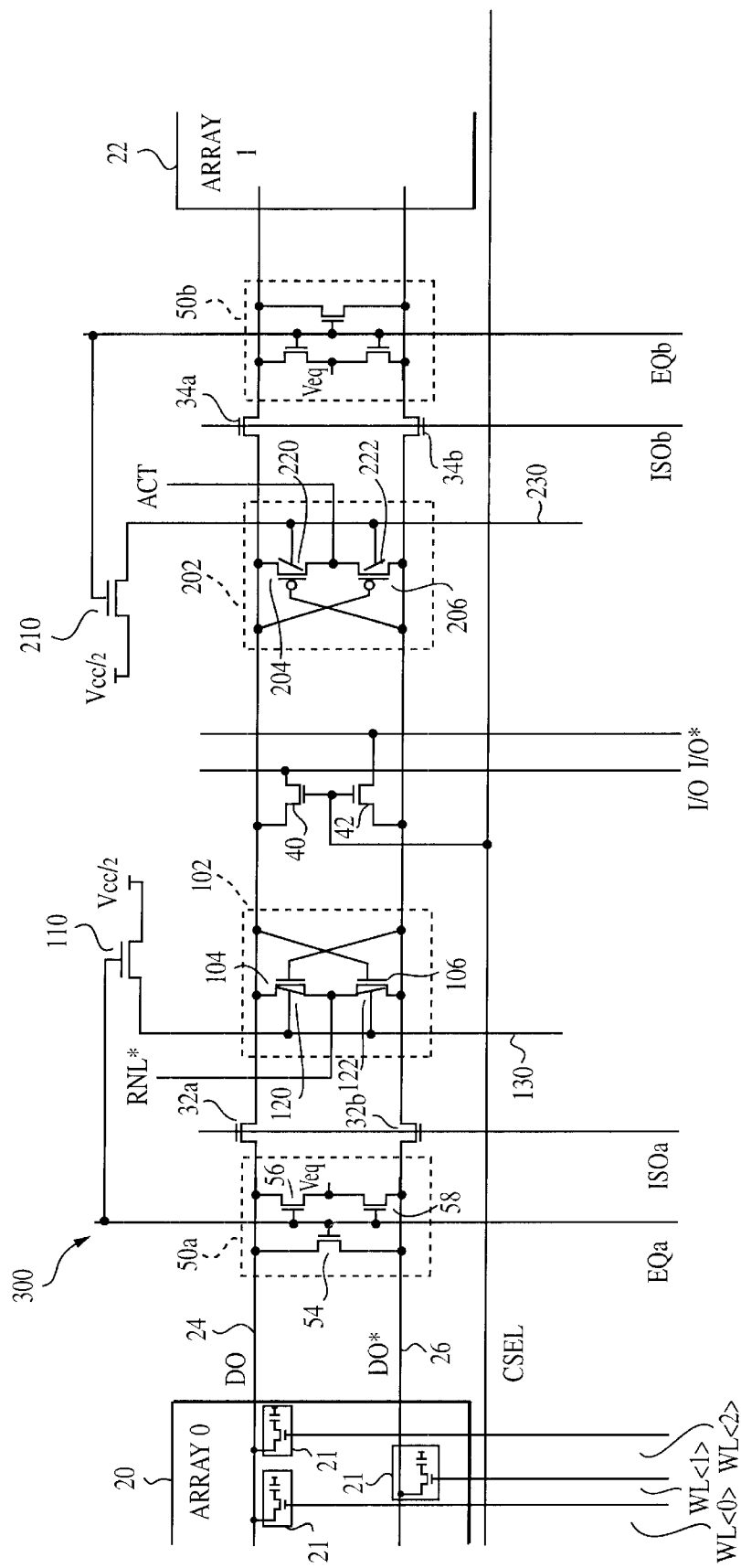
FIGS. 5A–5C illustrate a sense amplifier according to a third embodiment of the present invention.

In accordance with another embodiment of the present invention, the body nodes of the transistors in both the P-sense amplifier and N-sense amplifier can be pre-charged. FIG. 5A illustrates a sense amplifier circuit 300 that includes a pair of equilibration circuits 50a, 50b, isolation transistors 32a, 32b, 34a, 34b, and I/O transistors 40, 42. Each of these elements is similar to those described with respect to FIG. 1, and their description will not be repeated here. In accordance with the present invention, sense amplifier circuit 300 is further provided with an N-sense amplifier 102, as described with respect to FIG. 2, and a P-sense amplifier 202, as described with respect to FIG. 4. The operation of sense amplifier circuit 300 is similar to that as described with respect to FIGS. 2 and 4. Specifically, the body nodes 120, 122, 220, 222 of transistors 104, 106, 204 and 206 respectively will be precharged to Vcc/2, thereby lowering the threshold voltage $V_t$ of each of those transistors. When the cell access is to occur, the pre-charge voltage will be disconnected from the body nodes.

Figure 5B:
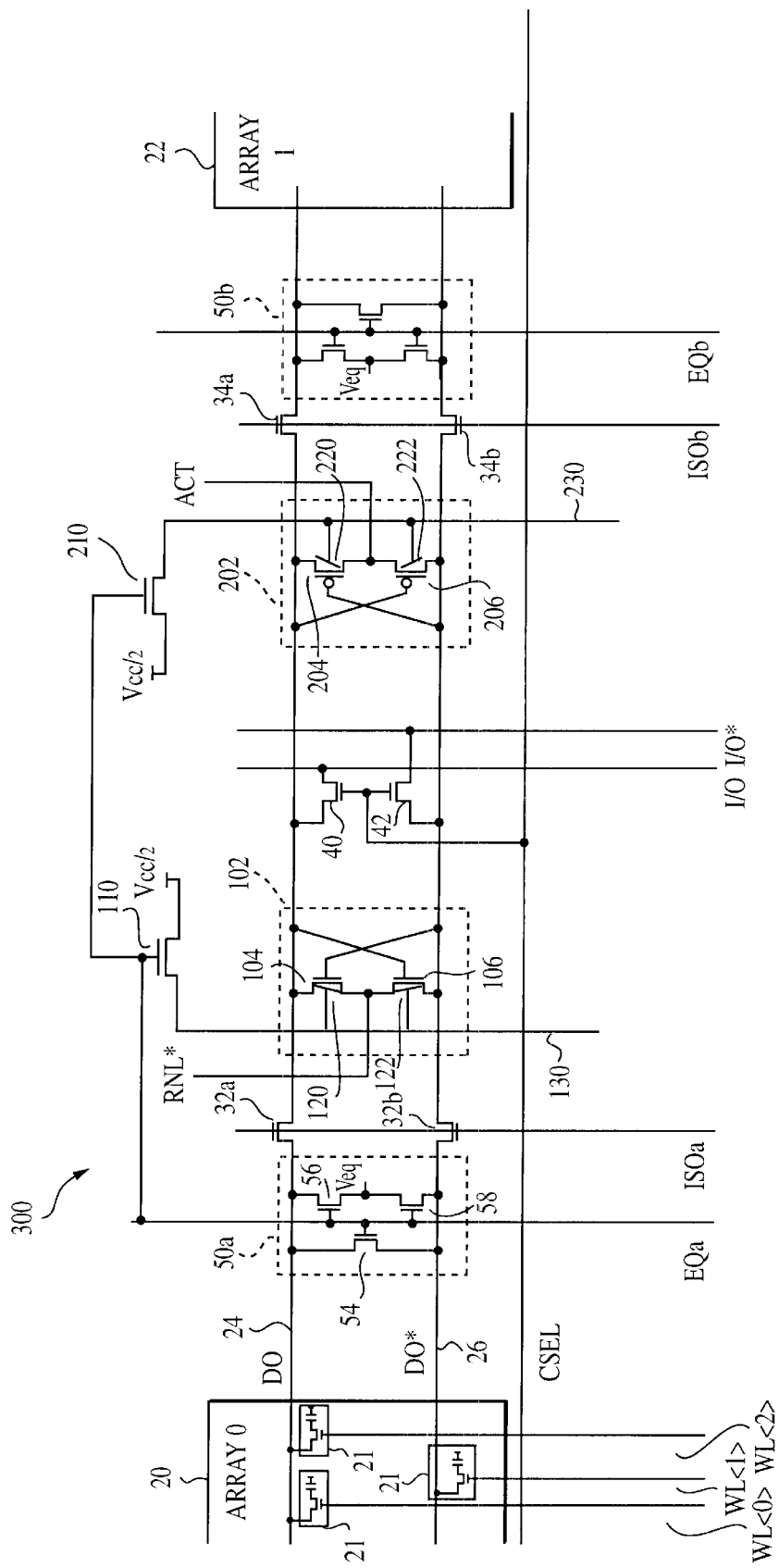
Figure 5C:
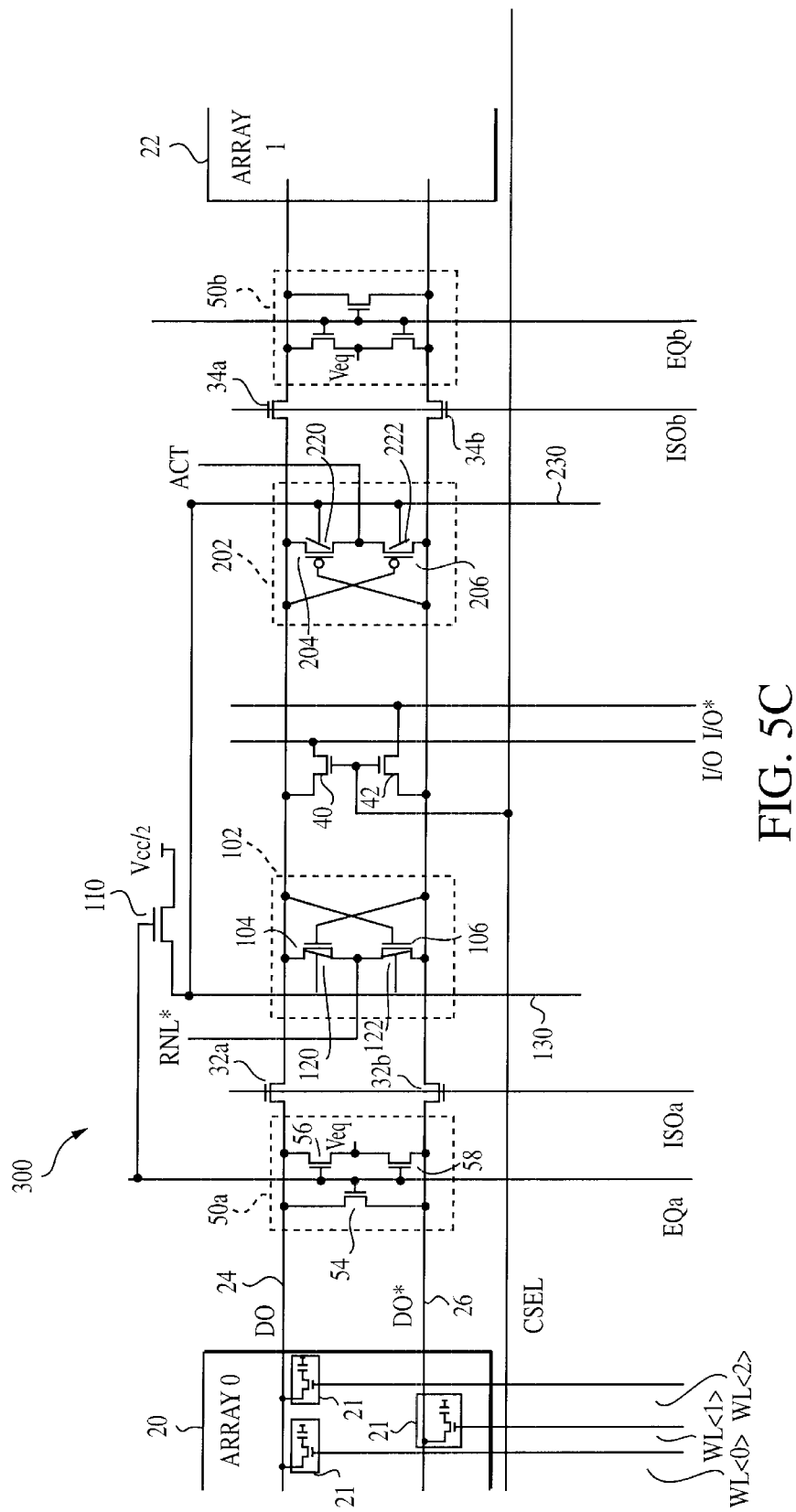

While FIG. 5A illustrates multiple transistors 110, 210 for connection of the pre-charge voltage to the body nodes of the N-sense amp 102 and P-sense amp 202 respectively, the invention is not so limited. Alternatively, both transistors 110 and 210 can have their gates connected to the same control signal as illustrated in FIG. 5B, or transistor 110 can be used to control the connection of the supply potential to the body nodes for both N-sense amplifier 102 and P-sense amplifier 202 as illustrated in FIG. 5C.

Figure 6:
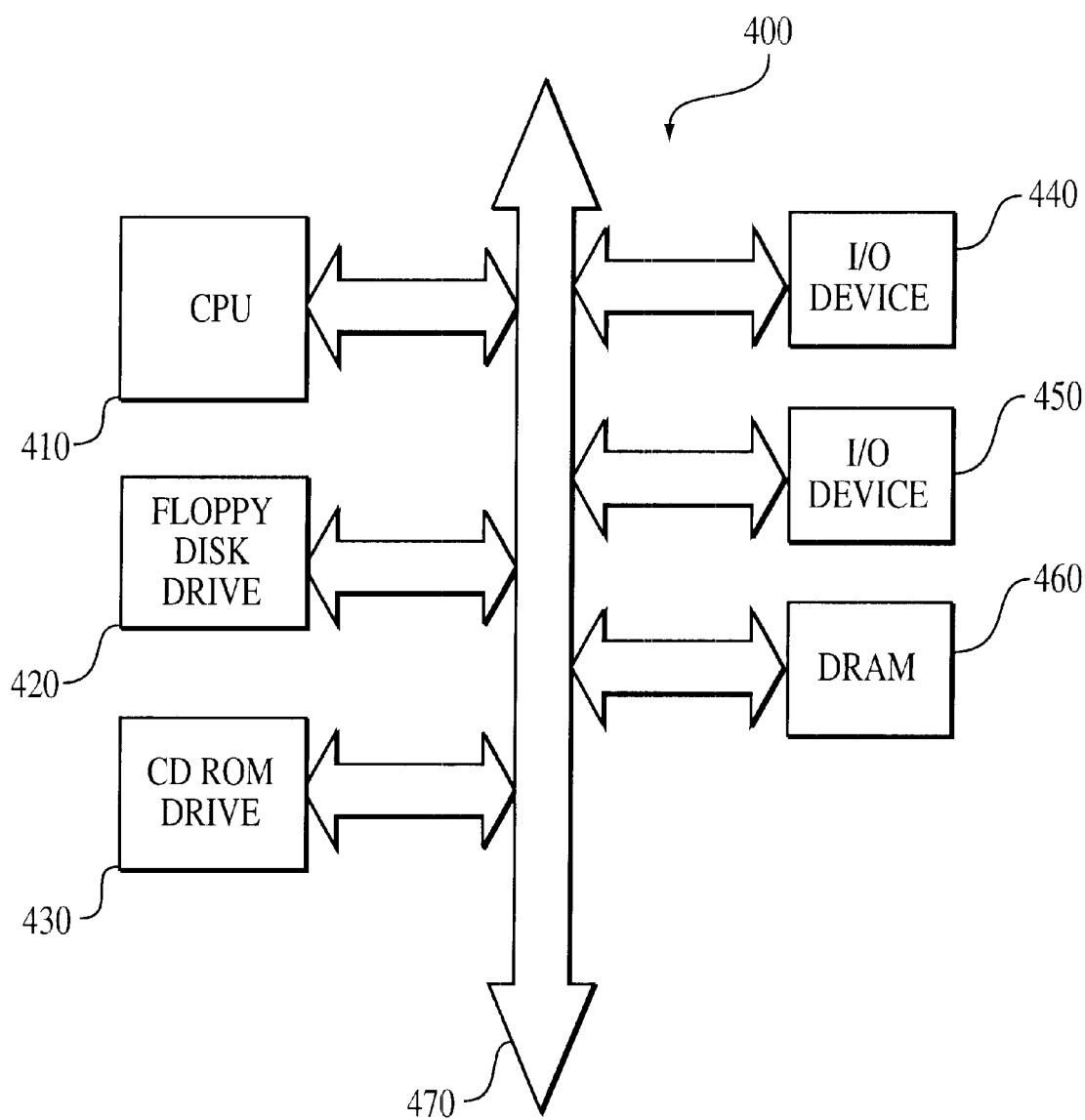
FIG. 6 illustrates in block diagram form a processor system that includes a DRAM having a sense amplifier in accordance with the present invention.

A typical processor based system that includes integrated circuits that utilize a sense amplifier according to the present invention is illustrated generally at 400 in FIG. 6. A computer system is exemplary of a system having integrated circuits, such as for example memory circuits. Most conventional computers include memory devices permitting storage of significant amounts of data. The data is accessed during operation of the computers. Other types of dedicated processing systems, e.g., radio systems, television systems, GPS receiver systems, telephones and telephone systems also contain memory devices which can utilize the present invention.

A processor based system, such as a computer system, for example, generally comprises a central processing unit (CPU) 410, for example, a microprocessor, that communicates with one or more input/output (I/O) devices 440, 450 over a bus 470. The computer system 400 also includes random access memory, such as DRAM 460, and, in the case of a computer system may include peripheral devices such as a floppy disk drive 420 and a compact disk (CD) ROM drive 430 which also communicate with CPU 410 over the bus 470. DRAM 460 is preferably constructed as an integrated circuit which includes a sense amplifier as previously described with respect to FIGS. 2–5. It may also be desirable to integrate the processor 410 and DRAM 460 on a single IC chip.

While preferred embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed as new and desired to be protected by Letters Patent of the United States is:

1. A sense amplifier comprising:
    a first amplifier circuit adapted to be connected between a pair of digit lines of a memory device, said first amplifier circuit having a first transistor and a second transistor, each of said first transistor and said second transistor having a body node;
    a third transistor having a first terminal connected to said body node of said first and second transistor, a second terminal connected to a voltage potential, and a gate terminal connected to receive a first control signal,
    wherein before said sense amplifier is activated, said first control signal turns on said third transistor to connect said voltage potential to said body node of said first and second transistor to thereby charge said body node of said first and second transistor to said voltage potential, and when said sense amplifier is activated said first control signal turns off said third transistor to disconnect said voltage potential from said body node of said first and second transistor.

2. The sense amplifier according to claim 1, wherein said first amplifier circuit is an N-sense amplifier.

3. The sense amplifier according to claim 2, wherein said first and second transistors are cross-coupled NMOS transistors.

4. The sense amplifier according to claim 1, wherein said first amplifier circuit is a P-sense amplifier.

5. The sense amplifier according to claim 4, wherein said first and second transistors are cross-coupled PMOS transistors.

6. The sense amplifier according to claim 1, wherein said voltage potential is Vcc/2.

7. The sense amplifier according to claim 1, wherein said first control signal is an equilibration signal.

8. The sense amplifier according to claim 1, wherein said first terminal of said third transistor is connected to said body node of said first and second transistor by a metal strap routed through said sense amplifier.

9. The sense amplifier according to claim 1, further comprising:
a second amplifier circuit adapted to be connected between said pair of digit lines of said memory device, said second amplifier circuit having a first transistor and a second transistor, each of said first transistor and said second transistor of said second amplifier circuit having a body node,
wherein said body node of said first and second transistor of said second amplifier circuit are adapted to be coupled to said voltage potential.

10. The sense amplifier according to claim 9, wherein said body node of said first and second transistor of said second amplifier circuit are connected to said first terminal of said third transistor, and wherein when said first control signal turns on said third transistor said body node of said first and second transistor of said second amplifier circuit are coupled to said voltage potential to thereby charge said body node of said first and second transistor of said second amplifier circuit to said voltage potential, and when said first control signal turns off said third transistor said voltage potential is disconnected from said body node of said first and second transistor of said second amplifier circuit.

11. The sense amplifier according to claim 9, further comprising:
a fourth transistor having a first terminal connected to said body node of said first and second transistor of said second amplifier circuit, a second terminal connected to said voltage potential, and a gate terminal connected to receive a second control signal,
wherein before said sense amplifier is activated, said second control signal turns on said fourth transistor to couple said voltage potential to said body node of said first and second transistor of said second amplifier circuit to thereby charge said body node of said first and second transistor of said second amplifier circuit to said voltage potential, and when said sense amplifier is activated said second control signal turns off said fourth transistor to disconnect said voltage potential from body node of said first and second transistor of said second amplifier circuit.

12. The sense amplifier according to claim 11, wherein said second control signal is an equilibration signal.

13. The sense amplifier according to claim 11, wherein said first control signal and said second control signal are identical signals.

14. The sense amplifier according to claim 11, wherein said first amplifier circuit is an N-sense amplifier and said second amplifier circuit is a P-sense amplifier.

15. The sense amplifier according to claim 14, wherein said first and second transistor of said first amplifier circuit are cross-coupled NMOS transistors and said first and second transistors of said second amplifier circuit are cross-coupled PMOS transistors.

16. The sense amplifier according to claim 11, wherein said voltage potential is Vcc/2.

17. The sense amplifier according to claim 1, wherein said first amplifier circuit further comprises:
a first diode connected between said body node of said first transistor and one of a source region and a drain region of said first transistor.

18. The sense amplifier according to claim 17, wherein said first amplifier circuit further comprises:
a second diode connected between said body node of said second transistor and one of a source region and a drain region of said second transistor.

19. A sense amplifier for a memory device comprising:
a first amplifier circuit connected between a pair of digit lines of said memory device, said first amplifier circuit including a plurality of transistors, each of said plurality of transistors having a body node;
a first control transistor having a first terminal connected to said body node of at least one of said plurality of transistors, a second terminal connected to a voltage potential, and a gate connected to a first control signal,
wherein before said sense amplifier is activated, said first control signal turns on said first control transistor to connect said voltage potential to said body node of said at least one of said plurality of transistors to thereby charge said body node of said at least one of said plurality of transistors to said voltage potential, and when said sense amplifier is activated said first control signal turns off said first control transistor to disconnect said voltage potential from said body node of said at least one of said plurality of transistors.

20. The sense amplifier according to claim 19, wherein said voltage potential is Vcc/2.

21. The sense amplifier according to claim 19, wherein said first control signal is an equilibration signal.

22. The sense amplifier according to claim 19, wherein said first amplifier circuit is an N-sense amplifier including a pair of cross-coupled NMOS transistors.

23. The sense amplifier according to claim 19, wherein said first amplifier circuit is a P-sense amplifier circuit including a pair of cross-coupled PMOS transistors.

24. The sense amplifier according to claim 19, further comprising:
a second amplifier circuit connected between a pair of digit lines of said memory device, said second amplifier circuit including a plurality of transistors, each of said plurality of transistors of said second amplifier circuit having a body node, said body node of at least one of said plurality of transistors being connected to said first terminal of said first control transistor;
wherein when said first control signal turns on said first control transistor, said body node of said at least one of said plurality of transistors of said second amplifier circuit is connected to said voltage potential to thereby charge said body node of said at least one of said plurality of transistors of said second amplifier circuit to said voltage potential, and when said first control signal turns off said first control transistor, said body node of said at least one of said plurality of transistors of said second amplifier circuit is disconnected from said voltage potential.

25. The sense amplifier according to claim 19, further comprising:
a second amplifier circuit connected between a pair of digit lines of said memory device, said second amplifier circuit including a plurality of transistors, each of said plurality of transistors of said second amplifier circuit having a body;
a second control transistor having a first terminal connected to said body node of at least one of said plurality of transistors of said second amplifier circuit, a second terminal connected to a voltage potential, and a gate connected to a second control signal,
wherein before said sense amplifier is activated, said second control signal turns on said second control transistor to connect said voltage potential to said body node of said at least one of said plurality of transistors of said second amplifier circuit to thereby charge said body node of said at least one of said plurality of transistors of said second amplifier circuit to said voltage potential, and when said sense amplifier is activated said second control signal turns off said second control transistor to disconnect said voltage potential from said body node of said at least one of said plurality of transistors of said second amplifier circuit.

26. The sense amplifier according to claim 25, wherein said first control signal and said second control signal are identical signals.

27. The sense amplifier according to claim 19, further comprising:
a plurality of diodes, each of said plurality of diodes being connected between a body node of a respective one of said plurality of transistors and one of a source and drain region of said respective one of said plurality of transistors.

28. A sense amplifier comprising:
an amplifier circuit formed in a substrate, said amplifier circuit comprising:
a first transistor having a body node of a first conductivity in said substrate;
a second transistor having a body node of said first conductivity in said substrate; and
active region in said substrate, said active region contacting said body nodes of said first and second transistors.

29. The sense amplifier according to claim 28, wherein said first conductivity is n-type and said active region is a p+ area.

30. The sense amplifier according to claim 28, wherein said amplifier circuit is an N-sense amplifier.

31. The sense amplifier according to claim 28, wherein said amplifier circuit is a P-sense amplifier.

32. A sense amplifier comprising:
an amplifier circuit formed in a substrate, said amplifier circuit comprising:
a first transistor having a body node of a first conductivity in said substrate;
a second transistor having a body node of said first conductivity in said substrate;
an active region in said substrate, said active region contacting said body nodes of said first and second transistors; and
a first diode connected between said body node of said first transistor and one of a source region and a drain region of said first transistor.

33. The sense amplifier according to claim 32, wherein said amplifier circuit further comprises:
a second diode connected between said body node of said second transistor and one of a source region and a drain region of said second transistor.

34. A memory device comprising:
a plurality of memory cells arranged in rows and columns;
a plurality of pairs of digit lines, each of said plurality of pairs of digit lines being associated with at least one of said plurality of memory cells; and
a plurality of sense amplifiers, each of said plurality of sense amplifiers comprising:
a first amplifier circuit connected between one of said plurality of pairs of digit lines, said first amplifier circuit having a first transistor and a second transistor, each of said first transistor and said second transistor having a body node;
a third transistor having a first terminal connected to said body node of said first and second transistor, a second terminal connected to a voltage potential, and a gate terminal connected to receive a first control signal,
wherein before said first amplifier circuit is activated, said first control signal turns on said third transistor to connect said voltage potential to said body node of said first and second transistor to thereby charge said body node of said first and second transistor to said voltage potential, and when said first amplifier circuit is activated said first control signal turns off said third transistor to disconnect said voltage potential from said body node of said first and second transistor.

35. The memory device according to claim 34, wherein said first amplifier circuit is an N-sense amplifier.

36. The memory device according to claim 35, wherein said first and second transistors are cross-coupled NMOS transistors.

37. The memory device according to claim 34, wherein said first amplifier circuit is a P-sense amplifier.

38. The memory device according to claim 37, wherein said first and second transistors are cross-coupled PMOS transistors.

39. The memory device according to claim 34, wherein said voltage potential is Vcc/2.

40. The memory device according to claim 34, wherein said first control signal is an equilibration signal.

41. The memory device according to claim 34, further comprising:
a second amplifier circuit connected between said one of said plurality of pairs of digit lines, said second amplifier circuit having a first transistor and a second transistor, each of said first transistor and said second transistor of said second amplifier circuit having a body node,
wherein said body node of said first and second transistor of said second amplifier circuit are adapted to be coupled to said voltage potential.

42. The memory device according to claim 41, wherein said body node of said first and second transistor of said second amplifier circuit are connected to said first terminal of said third transistor, and wherein when said first control signal turns on said third transistor said body node of said first and second transistor of said second amplifier circuit are coupled to said voltage potential to thereby charge said body node of said first and second transistor of said second amplifier circuit to said voltage potential, and when said first control signal turns off said third transistor said voltage potential is disconnected from said body node of said first and second transistor of said second amplifier circuit.

43. The memory device according to claim 41, further comprising:
a fourth transistor having a first terminal connected to said body node of said first and second transistor of said second amplifier circuit, a second terminal connected to said voltage potential, and a gate terminal connected to receive a second control signal,
wherein before said sense amplifier is activated, said second control signal turns on said fourth transistor to couple said voltage potential to said body node of said first and second transistor of said second amplifier circuit to thereby charge said body node of said first and second transistor of said second amplifier circuit to said voltage potential, and when said sense amplifier is activated said second control signal turns off said fourth transistor to disconnect said voltage potential from body node of said first and second transistor of said second amplifier circuit.

44. The memory device according to claim 43, wherein said second control signal is an equilibration signal.

45. The memory device according to claim 43, wherein said first control signal and said second control signal are identical signals.

46. The memory device according to claim 41, wherein said first amplifier circuit is an N-sense amplifier and said second amplifier circuit is a P-sense amplifier.

47. The memory device according to claim 46, wherein said first and second transistor of said first amplifier circuit are cross-coupled NMOS transistors and said first and second transistors of said second amplifier circuit are cross-coupled PMOS transistors.

48. The memory device according to claim 34, wherein said voltage potential is Vcc/2.

49. The memory device according to claim 34, wherein said first amplifier circuit further comprises:
a first diode connected between said body node of said first transistor and one of a source region and a drain region of said first transistor.

50. The memory device according to claim 49, wherein said first amplifier circuit further comprises:
a second diode connected between said body node of said second transistor and one of a source region and a drain region of said second transistor.

51. A memory device formed on a substrate, said memory device comprising:
a plurality of memory cells arranged in rows and columns;
a plurality of pairs of digit lines, each of said plurality of pairs of digit lines being associated with at least one of said plurality of memory cells; and
a plurality of sense amplifiers, each of said plurality of sense amplifiers comprising:
an amplifier circuit formed in said substrate, said amplifier circuit comprising:
a first transistor having a body node of a first conductivity in said substrate;
a second transistor having a body node of said first conductivity in said substrate; and
an active region in said substrate, said active region contacting said body nodes of said first and second transistors.

52. The memory device according to claim 51, wherein said first conductivity is n-type and said active region is a p+ area.

53. The memory device according to claim 51, wherein said amplifier circuit is an N-sense amplifier.

54. The memory device according to claim 51, wherein said amplifier circuit is a P-sense amplifier.

55. A memory device formed on a substrate, said memory device comprising:
a plurality of memory cells arranged in rows and columns;
a plurality of pairs of digit lines, each of said plurality of pairs of digit lines being associated with at least one of said plurality of memory cells; and
a plurality of sense amplifiers, each of said plurality of sense amplifiers comprising:
an amplifier circuit formed in said substrate, said amplifier circuit comprising:
a first transistor having a body node of a first conductivity in said substrate;
a second transistor having a body node of said first conductivity in said substrate;
an active region in said substrate, said active region contacting said body nodes of said first and second transistors; and
a first diode connected between said body node of said first transistor and one of a source region and a drain region of said first transistor.

56. The memory device according to claim 55, wherein said amplifier circuit further comprises:
a second diode connected between said body node of said second transistor and one of a source region and a drain region of said second transistor.

57. A processor system comprising:
a central processing unit; and
a memory device connected to said processing unit to receive data from and supply data to said central processing unit, said memory device comprising:
a plurality of memory cells arranged in rows and columns;
a plurality of pairs of digit lines, each of said plurality of pairs of digit lines being associated with at least one of said plurality of memory cells; and
a plurality of sense amplifiers, each of said plurality of sense amplifiers comprising:
a first amplifier circuit connected between one of said plurality of pairs of digit lines, said first amplifier circuit having a first transistor and a second transistor, each of said first transistor and said second transistor having a body node;
a third transistor having a first terminal connected to said body node of said first and second transistor, a second terminal connected to a voltage potential, and a gate terminal connected to receive a first control signal,
wherein before said first amplifier circuit is activated, said first control signal turns on said third transistor to connect said voltage potential to said body node of said first and second transistor to thereby charge said body node of said first and second transistor to said voltage potential, and when said first amplifier circuit is activated said first control signal turns off said third transistor to disconnect said voltage potential from said body node of said first and second transistor.

58. The processor system according to claim 57, wherein said first amplifier circuit is an N-sense amplifier.

59. The processor system according to claim 58, wherein said first and second transistors are cross-coupled NMOS transistors.

60. The processor system according to claim 57, wherein said first amplifier circuit is a P-sense amplifier.

61. The processor system according to claim 60, wherein said first and second transistors are cross-coupled PMOS transistors.

62. The processor system according to claim 57, wherein said voltage potential is Vcc/2.

63. The processor system according to claim 57, wherein said first control signal is an equilibration signal.

64. The processor system according to claim 57, further comprising:
a second amplifier circuit connected between said one of said plurality of pairs of digit lines, said second amplifier circuit having a first transistor and a second transistor, each of said first transistor and said second transistor of said second amplifier circuit having a body node,
wherein said body node of said first and second transistor of said second amplifier circuit are adapted to be coupled to said voltage potential.

65. The processor system according to claim 64, wherein said body node of said first and second transistor of said second amplifier circuit are connected to said first terminal of said third transistor, and wherein when said first control signal turns on said third transistor said body node of said first and second transistor of said second amplifier circuit are coupled to said voltage potential to thereby charge said body node of said first and second transistor of said second amplifier circuit to said voltage potential, and when said first control signal turns off said third transistor said voltage potential is disconnected from said body node of said first and second transistor of said second amplifier circuit.

66. The processor system according to claim 64, further comprising:

a fourth transistor having a first terminal connected to said body node of said first and second transistor of said second amplifier circuit, a second terminal connected to said voltage potential, and a gate terminal connected to receive a second control signal, wherein before said sense amplifier is activated, said second control signal turns on said fourth transistor to couple said voltage potential to said body node of said first and second transistor of said second amplifier circuit to thereby charge said body node of said first and second transistor of said second amplifier circuit to said voltage potential, and when said sense amplifier is activated said second control signal turns off said fourth transistor to disconnect said voltage potential from body node of said first and second transistor of said second amplifier circuit.

67. The processor system according to claim 66, wherein said second control signal is an equilibration signal.

68. The processor system according to claim 66, wherein said first control signal and said second control signal are identical signals.

69. The processor system according to claim 64, wherein said first amplifier circuit is an N-sense amplifier and said second amplifier circuit is a P-sense amplifier.

70. The processor system according to claim 69, wherein said first and second transistor of said first amplifier circuit are cross-coupled NMOS transistors and said first and second transistors of said second amplifier circuit are cross-coupled PMOS transistors.

71. The processor system according to claim 57, wherein said voltage potential is Vcc/2.

72. The processor system according to claim 57, wherein said central processing unit and said memory device are on a single chip.

73. The processor system according to claim 57, wherein said first amplifier circuit further comprises:

a first diode connected between said body node of said first transistor and one of a source region and a drain region of said first transistor.

74. The processor system according to claim 73, wherein said first amplifier circuit further comprises:

a second diode connected between said body node of said second transistor and one of a source region and a drain region of said second transistor.

75. A method for operating a sense amplifier, said sense amplifier including an amplifier circuit having a plurality of transistors, each of said plurality of transistors having a body node, said method comprising the steps of:

connecting said body node of at least one of said plurality of transistors of said amplifier circuit to a voltage potential;

charging said body node of said at least one of said plurality of transistors to said voltage potential;

disconnecting said body node of said at least one of said plurality of transistors of said amplifier circuit from said voltage potential; and providing an operation signal to said amplifier circuit to activate said amplifier circuit.

76. The method according to claim 75, wherein said step of connecting further comprises:

turning on a control transistor to connect said body node of said at least one transistor of said amplifier circuit to said voltage potential.

77. The method according to claim 76, wherein said step of turning on further comprises:

providing a control signal to said transistor to turn on said transistor.

78. The method according to claim 77, wherein said control signal is an equilibration signal.

79. The method according to claim 78, wherein said step of disconnecting further comprises:

turning off said transistor to disconnect said body node of said at least one of said plurality of transistors of said amplifier circuit from said voltage potential.

80. The method according to claim 75, wherein said amplifier circuit is an N-sense amplifier.

81. The method according to claim 80, wherein said plurality of transistors includes a pair of cross-coupled NMOS transistors.

82. The method according to claim 75, wherein said amplifier circuit is a P-sense amplifier.

83. The method according to claim 82, wherein said plurality of transistors includes a pair of cross-coupled PMOS transistors.

84. The method according to claim 75, wherein said voltage potential is Vcc/2.

85. The method according to claim 75, further comprising:

decreasing said charge of said body node of said at least one of said plurality of transistors of said amplifier circuit.

86. The method according to claim 85, wherein said step of decreasing further comprises:

biasing a diode connected between said body node of said at least one of said plurality of transistors and one of a drain and source region of said at least one of said plurality of transistors, said biasing causing said diode to conduct, thereby decreasing said charge of said body node.

87. The method according to claim 85, wherein said step of decreasing further comprises:

increasing a threshold voltage of said at least one of said plurality of transistors of said amplifier circuit.

88. A method for operating a sense amplifier, said sense amplifier including a first and second amplifier circuit, each of said first and second amplifier circuits having a plurality of transistors, each of said plurality of transistors having a body node, said method comprising the steps of:

connecting said body node of at least one of said plurality of transistors of said first and second amplifier circuit to a voltage potential;

charging said body node of said at least one of said plurality of transistors of said first and second amplifier circuit to said voltage potential;

disconnecting said body node of said at least one of said plurality of transistors of said first and second amplifier circuit from said voltage potential; and providing an operation signal to said amplifier circuit to activate said amplifier circuit.

89. The method according to claim 88, wherein said step of connecting further comprises:

turning on a control transistor to connect said body node of said at least one transistor of said first and second amplifier circuit to said voltage potential.

90. The method according to claim 89, wherein said step of turning one further comprises:

providing a control signal to said transistor to turn on said transistor.

91. The method according to claim 88, wherein said step of connecting further comprises:

turning on a first control transistor to connect said body node of said at least one transistor of said first amplifier circuit to said voltage potential; and turning on a second control transistor to connect said body node of said at least one transistor of said second amplifier circuit to said voltage potential.

92. The method according to claim 91, wherein said steps of turning on further comprise:

providing a control signal to said first control transistor to turn on said first control transistor; and providing said control signal to said second control transistor to turn on said second control transistor.

93. The method according to claim 92, wherein said control signal is an equilibration signal.

94. The method according to claim 91, wherein said step of turning on said first control transistor further comprises:

providing a first control signal to said first control transistor to turn on said first control transistor.

95. The method according to claim 94, wherein said step of turning on said second control transistor further comprises:

providing a second control signal to said second control transistor to turn on said second control transistor.

96. The method according to claim 88, wherein said first amplifier circuit is an N-sense amplifier.

97. The method according to claim 96, wherein said second amplifier circuit is an P-sense amplifier.

98. The method according to claim 88, wherein said voltage potential is Vcc/2.

99. The method according to claim 88, further comprising:

decreasing said charge of said body node of said at least one of said plurality of transistors of said first and second amplifier circuit.

100. The method according to claim 99, wherein said step of decreasing further comprises:

biasing a diode connected between said body node of said at least one of said plurality of transistors of said first and second amplifier circuit and one of a drain and source region of said at least one of said plurality of transistors, said biasing causing said diode to conduct, thereby decreasing said charge of said body node.

101. The method according to claim 99, wherein said step of decreasing further comprises:

increasing a threshold voltage of said at least one of said plurality of transistors of said first and second amplifier circuit.

* * * * *